US006462981B2

United States Patent
Numata et al.

(10) Patent No.: US 6,462,981 B2
(45) Date of Patent: Oct. 8, 2002

(54) MAGNETIC RANDOM ACCESS MEMORY

(75) Inventors: Hideaki Numata; Koichi Takeda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/884,669

(22) Filed: Jun. 19, 2001

(65) Prior Publication Data

US 2002/0008987 A1 Jan. 24, 2002

(30) Foreign Application Priority Data

Jun. 19, 2000 (JP) .......................................... 2000-182672

(51) Int. Cl.[7] .............................................. G11C 11/00
(52) U.S. Cl. ......................... 365/158; 365/171; 365/173
(58) Field of Search ................................ 365/158, 171, 365/173, 97, 157, 205, 209

(56) References Cited

U.S. PATENT DOCUMENTS

| 5,640,343 | A | | 6/1997 | Gallagher et al. | ........... | 365/171 |
| 5,699,293 | A | * | 12/1997 | Tehrani et al. | ............... | 365/158 |
| 5,748,519 | A | | 5/1998 | Tehrani et al. | ................. | 365/98 |
| 6,317,375 | B1 | * | 11/2001 | Perner | ......................... | 365/206 |
| 6,317,376 | B1 | * | 11/2001 | Tran et al. | ................... | 365/210 |

OTHER PUBLICATIONS

"Bias Voltage Dependence of Tunneling Magnetoresistance and Annealing Effect in Spin Dependent Tunnel Junctions", J.J. Sun et al, Journal of Magnetics Society of Japan, vol. 23, No. 1–2, pp. 55–57, Jan. 1999.

"Observation and analysis of breakdown of magnetic tunnel junctions", W. Oepts, et al, Journal of Magnetism and Magnetic Materials vol. 198–199, pp.164–166.

* cited by examiner

Primary Examiner—Richard Elms
Assistant Examiner—Anh Phung
(74) Attorney, Agent, or Firm—Scully, Scott, Murphy & Presser

(57) ABSTRACT

A matrix array of memory cells are located on intersections of word lines and sense lines. Each memory cell includes a magnetoresistance element and a switching element which establishes a resistive connection between a corresponding sense line and the magnetoresistance element when a corresponding word line is addressed. A number of sense circuits are respectively correspond to the sense lines. Each sense circuit includes a capacitive element connected to the corresponding sense line and a switching element for applying a voltage to the capacitive element and removing the voltage when the corresponding sense line is addressed, thereby discharging energy from the capacitive element through the resistive connection to the magnetoresistance element. The voltage developed across the capacitive element of each sense circuit is used to produce a binary output signal representative of information stored in an address memory cell.

14 Claims, 5 Drawing Sheets

MAGNETIC RANDOM ACCESS MEMORY

BACKGROUND OF THE INVENTION

1. Field of the Invention

The present invention relates generally to nonvolatile random access memories and more specifically to a magnetic random access memory using a magnetoresistance element.

2. Description of the Related Art

U.S. Pat. No. 5,748,519 discloses a magnetic RAM in which magnetic memory cells are each comprised of a giant magnetoresistance element and organized into first and second array portions. In each row of the first array portion, the GMRs are connected in series between a row transistor and a first common output line. Likewise, in each row of the second array portions, the GMRs are connected in series between a row transistor and a second common output line. During a read mode, a current is produced in the GMRs of a selected row of the first cell array portion as well as in the GMRs of the corresponding row of the second cell array portion. One of the cell array portions is used to produce a reference voltage. The voltage developed on each common output line is proportional to the total value of the resistances of the series-connected memory cells. A differential amplifier is connected to the first and second common lines to produce an output voltage representing the difference between the voltages developed on the first and second output lines. However, parasitic elements arise from the physical separation of the cell array into the two array portions. Therefore, if variability exists in the operating characteristics of the magnetoresistance elements of the memory it is difficult to implement a magnetic RAM having a sufficient amount of operating margin. In addition, since the total resistance of a selected row contributes to a significant portion of the voltage developed at the common output line, the amount of the voltage contributed by a memory cell of the selected row is small. As a result, the prior art magnetic RAM is less tolerant of cell variability and noise. The problem could be overcome only at the cost of an increase in the resistance of each GMR element, which would require an increase both in power consumption and memory chip size. Furthermore, the total value of the resistances of each selected row inherently includes the turn-on resistance of each row transistor. Since the GMR is a type of device whose resistance is of the same order of magnitude as the resistance of the associated line, the voltage drop contributed by the row transistor and the associated line resistance to the output voltage cannot be ignored, requiring precision sense amplifiers.

U.S. Pat. No. 5,640,343 discloses a magnetic memory array. Each memory cell consists of a magnetic tunnel junction (TMR) element and a diode electrically connected in series. However, a paper titled "Bias Voltage Dependence of Tunneling Magnetoresistance and Annealing Effect in Spin Dependent Tunnel Junctions", J. J. Sun et al, Journal of Magnetics Society of Japan, Vol. 23, No. 1–2, pages 55–57, describes that as the voltage across the tunnel junction increases the magnetoresistance (MR) ratio decreases due to the known bias effect, and hence precision sense amplifiers would be required to detect voltage variations. Further, the tunneling magnetoresistance element cannot tolerate high voltages as described in a paper under the title of "Observation and analysis of breakdown of magnetic tunnel junctions", W. Oepts, et al, Journal of Magnetism and Magnetic Materials Vol. 198–199, pages 164–166. The application of a high voltage across a tunneling magnetoresistance element would break down the tunnel barrier and shorten its lifetime.

SUMMARY OF THE INVENTION

It is therefore an object of the present invention to provide a magnetic random access memory tolerant of variability of the operating characteristics of magnetoresistance elements and capable of operating with a sufficient margin of allowance.

A second object of the present invention is to provide a magnetic random access memory capable of precision readout operation by compensating for the voltage drop caused by the line resistance and transistor's turn-on resistance connected in series.

A third object of the present invention is to provide a magnetic random access memory capable of high speed readout operation by simultaneously reading stored information from a plurality of memory cells connected to the same word line.

A fourth object of the present invention is to provide a magnetic random access memory using tunneling magnetoresistance elements in the memory cells capable of preventing the breakdown of their tunnel barrier and their bias effect of the tunneling magnetoresistance elements.

A fifth object of the present invention is to provide a magnetic random access memory of small chip size by utilizing parasitic capacitances of the sense lines.

A sixth object of the present invention is to provide a low power consumption magnetic random access memory by utilizing energy stored on capacitors.

According to a first aspect, the present invention provides a magnetic random access memory which comprises a plurality of word lines, a plurality of sense lines, a matrix array of memory cells, each memory cell being located on an intersection of a corresponding one of the word lines and a corresponding one of the sense lines, each memory cell including a magnetoresistance element and a switching element which establishes a resistive connection between the corresponding sense line and the magnetoresistance element when the corresponding word line is addressed, and a plurality of sense circuits respectively corresponding to the sense lines, each sense circuit including a capacitive element connected to the corresponding sense line and a switching element for applying a voltage to the capacitive element and removing the voltage when the corresponding sense line is addressed, thereby discharging energy from the capacitive element through the resistive connection to the magnetoresistance element.

According to a second aspect, the present invention provides a magnetic random access memory comprising a plurality of word lines, a plurality of pairs of sense lines, a matrix array of memory cells, each memory cell being located on an intersection of a corresponding one of the word lines and a corresponding one of the pairs of the sense lines, each memory cell including a first magnetoresistance element and a first switching element which establishes a first resistive connection between a first one of the corresponding pair of sense lines and the first magnetoresistance element when the corresponding word line is addressed, each memory cell further including a second magnetoresistance element and a second switching element which establishes a second resistive connection between a second one of the corresponding pair of sense lines and the second magnetoresistance element when the corresponding word lines is addressed, and a plurality of sense circuits respectively corresponding to the pairs of sense lines, each sense circuit including a first capacitive element connected to a first one of the corresponding pair of sense lines and a first switching element for applying a voltage to the first capacitive element and removing the voltage when the first one of the corresponding pair of sense lines is addressed, thereby discharging energy from the first capacitive element through the first resistive connection to the first magnetoresistance element, each sense circuit further including a second capacitive element connected to a second one of the corresponding pairs of sense lines and a second switching element for applying a voltage to the second capacitive element and removing the voltage when the second one of the corresponding pair of sense lines is addressed simultaneously with the first one of the corresponding pair of sense lines, thereby discharging energy from the second capacitive element through the second resistive connection to the second magnetoresistance element. A plurality of differential amplifiers may be provided respectively corresponding to the sense circuits, each of the differential amplifiers producing a difference output representative of the difference between voltages developed by the first and second capacitive elements.

According to a third aspect, the present invention provides a magnetic random access memory comprising a first plurality of word lines, a second plurality of word lines, a first plurality of sense lines, a second plurality of sense lines, a first plurality of reference cells respectively corresponding to the first plurality of sense lines, each reference cell including a resistance element and a switching element for establishing a resistive connection between the resistance element and the corresponding sense line when one of the second plurality of word lines is addressed, a second plurality of reference cells respectively corresponding to the second plurality of sense lines, each reference cell including a resistance element and a switching element for establishing a resistive connection between the resistance element and the corresponding sense line when one of the first plurality of word lines is addressed, a first matrix array of memory cells, each memory cell being located on an intersection of a corresponding one of the first plurality of word lines and a corresponding one of the first plurality of sense lines, each memory cell including a magnetoresistance element and a switching element for establishing a resistive connection between the corresponding sense line and the magnetoresistance element when the corresponding word line is addressed, a second matrix array of memory cells, each memory cell being located on an intersection of a corresponding one of the second plurality of word lines and a corresponding one of the second plurality of sense lines, each memory cell including a magnetoresistance element and a switching element for establishing a resistive connection between the corresponding sense line and the magnetoresistance element when the corresponding word line is addressed, a first plurality of sense circuits respectively corresponding to the first plurality of sense lines, each sense circuit including a capacitive element connected to the corresponding sense line and a switching element for applying a voltage to the capacitive element and removing the voltage when the corresponding sense line is addressed for discharging energy from the capacitive element to the corresponding sense line, and a second plurality of sense circuits respectively corresponding to the second plurality of sense lines, each sense circuit including a capacitive element connected to the corresponding sense line and a switching element for applying a voltage to the capacitive element and removing the voltage when the corresponding sense line is addressed for discharging energy from the capacitive element to the corresponding sense line. A plurality of differential amplifiers may be provided so that each of the differential amplifiers produces an output voltage representative of the difference between a voltage developed across the capacitive element of a corresponding one of the first plurality of sense circuits and a voltage developed across the capacitive element of a corresponding one of the second plurality of sense circuits.

According to a fourth aspect, the present invention provides a magnetic random access memory comprising a plurality of word lines, a plurality of sense lines, a matrix array of memory cells, each memory cell being located on an intersection of a corresponding one of the word lines and a corresponding one of the sense lines, each memory cell including a magnetoresistance element and a switching element which establishes a resistive connection between the corresponding sense line and the magnetoresistance element when the corresponding word line is addressed, and a plurality of sense circuits respectively corresponding to the sense lines. Each sense circuit includes a first capacitive element, a first switching element for applying a voltage to the first capacitive element through a first circuit node, a second capacitive element, a second switching element for applying a voltage to the second capacitive element through a second circuit node, and a third switching element for exclusively connecting one of the first circuit node and the second circuit node to the corresponding sense line. Further provided are a column decoder and a row decoder for selectively addressing the sense lines and the word lines, respectively. The column decoder is responsive to control signals from a timing controller for controlling the first, second and third switching elements of one of the sense circuits corresponding to the addressed sense line for discharging energy thereto from the first capacitive element of the sense circuit and discharging energy thereto from the second capacitive element of the sense circuit. A write circuit is provided for initially setting each memory cell addressed by the column and row decoders in one of high and low resistance states depending on information to be stored therein. The write circuit is responsive to a control signal from the timing controller for setting the addressed memory cell in a reference resistance state after energy is discharged from the first capacitive element. A plurality of differential amplifiers may be provided corresponding to the sense circuits. Each differential amplifier may be connected to the first and second circuit nodes of the corresponding sense circuit for producing a voltage representative of the difference between voltages developed at the first and second circuit nodes.

According to a fifth aspect, the present invention provides a magnetic random access memory comprising a plurality of word lines, a plurality of sense lines, a matrix array of memory cells, each memory cell being located on an intersection of a corresponding one of the word lines and a corresponding one of the sense lines. Each memory cell includes a magnetoresistance element and a switching element which establishes a resistive connection between the corresponding sense line and the magnetoresistance element when the corresponding word line is addressed. A plurality of sense circuits are provided respectively corresponding to the sense lines. Each sense circuit includes a capacitive element connected to the corresponding sense line and a switching element for applying a voltage to the capacitive element and removing the voltage when the corresponding sense line is addressed, thereby discharging energy from the capacitive element through the resistive connection to the magnetoresistance element. A column decoder selectively addresses the sense lines and a row decoder selectively addresses the word lines. A plurality of voltage controllers are respectively connected to the word lines. A controller is provided for respectively controlling the voltage controllers according to the voltages respectively produced by the sense circuits when the memory cells are individually addressed by the column and row decoders during a calibration mode so that the voltages produced by the sense circuits are adjusted to an equal value and producing, for each of the memory cells, a trimming value by which each of the voltage controllers is controlled. A nonvolatile memory is provided for storing the trimming values. The controller is arranged to read a trimming value from the nonvolatile memory corresponding to each of the memory cells addressed during a read mode and controlling one of the voltage controllers corresponding to the addressed memory cell according to the read value.

BRIEF DESCRIPTION OF THE DRAWINGS

The present invention will be described in detail further with reference to the following drawings, in which.

DETAILED DESCRIPTION

Figure 1:
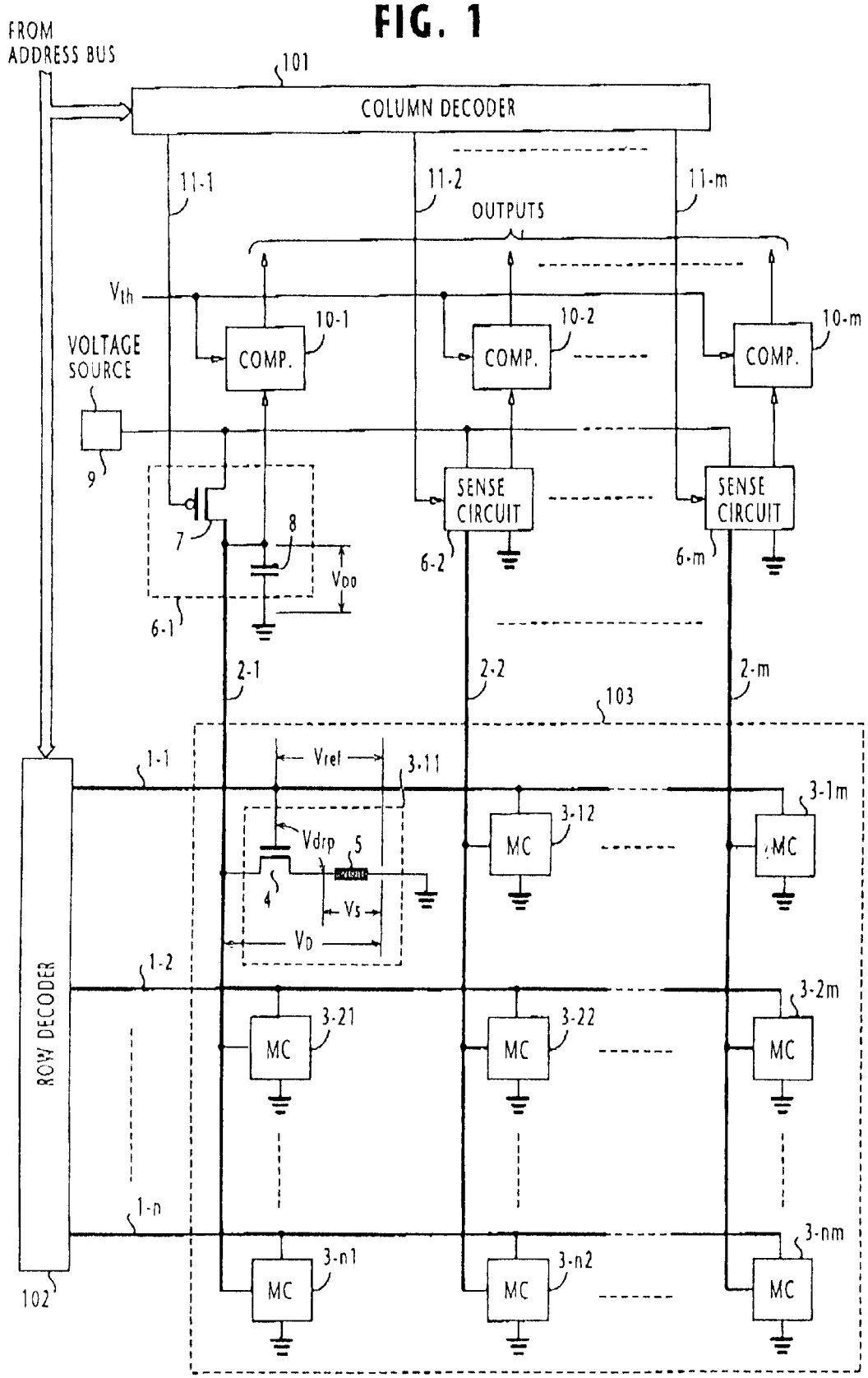
FIG. 1 is a block diagram of a magnetic random access memory according to a first embodiment of the present invention.

Referring now to FIG. 1, there is shown a magnetic random access memory (MRAM) according to a first embodiment of the present invention. The magnetic RAM is comprised of a column decoder 101, a row decoder 102, and a memory cell array 103.

Memory cell array 103 includes a plurality of memory cells 3 arrayed on intersections of word lines 1-1 through 1-n and sense lines 2-1 through 2-m. Each memory cell is made up of a MOS switching transistor 4 and a magnetoresistance element 5 of either tunnel junction type (TMR) or a giant magnetoresistance type (GMR). The gate of the switching transistor 4 is connected to the associated word line and the drain of the transistor is connected to the associated sense line 2. The source of the switching transistor is connected through the magnetoresistance element 5 to ground.

Although not shown in the drawings, there is also provided a write circuit which includes an array of coils arranged in locations respectively corresponding to the memory cells 3 for magnetizing their magnetoresistance elements.

Sense lines 2-1~2-m are driven by a plurality of sense circuits 6-1~6-m, respectively. Each of the sense circuits 6 includes a MOS switching transistor 7 and a capacitor 8. Switching transistor 7 has its source-drain path connected between a voltage source 9 and the associated sense line 2 and the gate coupled to a corresponding output line 11 of the column decoder 101 so that the transistor 7 is normally in an ON state when the corresponding output line is at low level and charges the capacitor 8 to a voltage of initial level $V_{D0}$ supplied from the voltage source 9. Thus, all sense lines are normally maintained at voltage $V_{D0}$. A plurality of comparators 10-1~10m are provided. Each comparator 10 is connected to the circuit node between the transistor 7 and the capacitor 8 to detect a voltage change that occurs when a memory cell is addressed and produces an output voltage at one of two discrete values depending on whether the voltage change is higher or lower than a threshold voltage $V_{th}$.

Word lines 1-1~1-n are addressed by the row decoder 102 in response to a row address supplied from an address bus, not shown. When the row decoder 102 addresses a word line, it applies a voltage $V_{ref}$ to the gates of all transistors 4 that are connected to that word line. Switching transistor 4 functions as a voltage dropping element as well as a cell selecting element. When the voltage $V_{ref}$ is applied to a word line, all the switching transistors 4 of the word line are turned ON, so that there is a voltage drop $V_{drp}$ in each of these transistors, where $V_{drp}$ is determined by the threshold level of the transistors. As a result, a voltage $V_S$ develops across the magnetoresistance element 5. As long as the sense-line voltage $V_D$ is higher than the voltage $V_S$, the following relation holds.

$$V_S = V_{ref} - V_{drp} \qquad (1)$$

Therefore, even though there is a variation in the sense-line voltage $V_D$, the voltage $V_S$ that is impressed to the magnetoresistance element 5 remains constant. A current of constant value flows through all the magnetoresistance elements of the addressed word line.

In response to a column address from the address bus, the column decoder 101 selects one of the sense lines. This is achieved by the application of a voltage from the column decoder 101 to the gate of transistor 7 of the sense line to be selected. As a result, the transistor 7 of the selected sense line turns OFF and the capacitor 8 begins to discharge its stored energy. Since the Equation (1) holds as long as the line voltage $V_D$ of the selected sense line is higher than the voltage $V_S$, the current of constant value continues to flow through the magnetoresistance element 4 of the selected memory cell.

The voltage $V_D(t)$ developed by the capacitor 8 when it is discharged varies with time as follows:

$$V_D(t) = V_{D0} - \frac{1}{C}\int I_S dt = V_{D0} - \frac{V_S}{CR}t \qquad (2)$$

where, C is the value of capacitor 8, $I_S$ is the current flowing through the magnetoresistance element 5, and R is the load resistance of transistor 4.

Therefore, when the magnetoresistance element 5 is in a high resistance state, a small time-varying voltage is developed by the capacitor 8. Otherwise, a large time-varying voltage is produced. Since the resistance of the magnetoresistance element 5 is determined by the logical value of the information to be stored in the memory cell 3, a binary output "1" or "0" is produced by the corresponding comparator 10.

Since the voltage $V_S$ is uniquely determined by Equation (1), the magnetoresistance element 5 can be operated with a voltage lower than its deleterious breakdown voltage. On the other hand, the level of read-out voltage produced by the capacitor 8 can be determined at a level sufficient for the corresponding comparator 10 to clearly distinguish between two binary levels. In particular, even if the magnetoresistance element is connected in series with a high parasitic resistance or has a low magneto-resistance ratio, a sufficient level of read-out voltage can be developed by the capacitor by optimizing the capacitance C, the voltage $V_S$, the electrical resistance of the magnetoresistance element 5, and the length of time "t" required for the capacitor 8 to discharge its stored energy.

In addition, the read-out speed of the magnetic RAM of this invention is primarily determined by the capacitance C, the voltage $V_S$, the electrical resistance of the magnetoresistance element 5. Therefore, a high speed read operation can be achieved by optimizing these parameters. Note that since capacitors 8 are charged during an idle period, the read operation of the magnetic RAM is not adversely affected when the capacitors 8 are charged.

As described above, the transistors 4 of the word line are simultaneously turned ON, causing currents to flow through the magnetoresistance elements of the same word line. Therefore, more than one memory cell can be read out in parallel from the same word line by simultaneously turning off the corresponding transistors 7. Since the read operation of this invention is based on the utilization of the energy stored on capacitors, the power needed for this simultaneous readout is significantly small, and hence a high readout efficiency can be achieved in terms of the ratio of the amount of data read out of the memory to the amount of power needed to read the data.

While mention has been made of a sequence in which the transistor 4 of memory cell is first turned on, followed by the turn-off of the corresponding transistor 7, the present invention could equally be as well operated when the sequence of operation is reversed, or when they are simultaneously operated. In addition, if the sense lines 2 have parasitic capacitances capable of storing sufficient energy for read operation, the sense lines can be used instead of the capacitors 8.

In the first embodiment, the comparison is made with reference to a constant threshold level to deliver an output signal. In a second embodiment shown in FIG. 2, the distinction between the two discrete levels is enhanced and consistent circuit operation is ensured against variability of manufacturing process by comparing voltages resultant from complementarily different resistance states of magnetoresistance elements.

Figure 2:
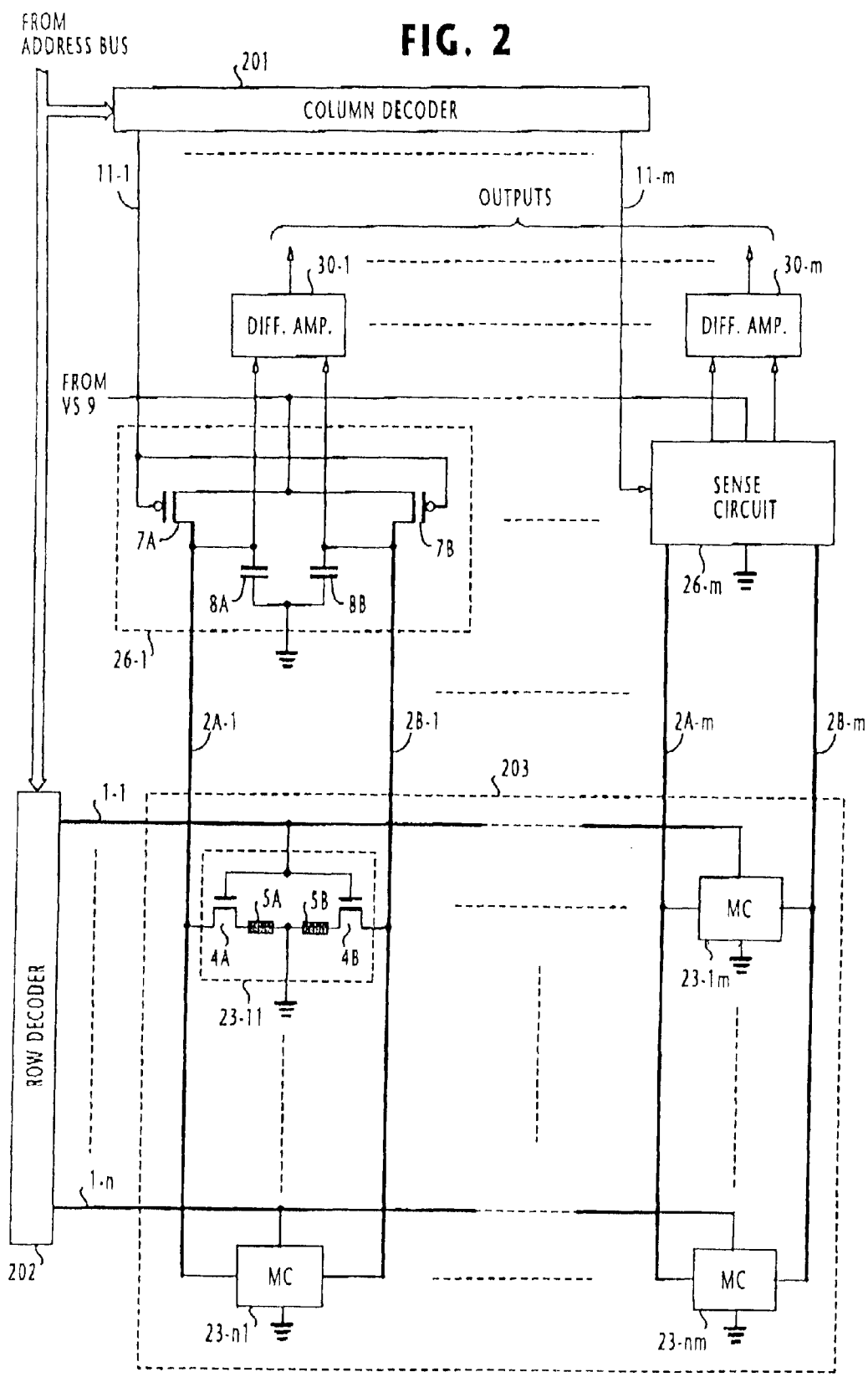
FIG. 2 is a block diagram of a magnetic random access memory according to a second embodiment of the present invention.

In the cell array 203 of FIG. 2, each memory cell 23 is connected to a pair of sense lines 2A, 2B and a word line 1 from the row decoder 202 and is composed of transistors 4A, 4B and magnetoresistance elements 5A, 5B. Paired sense lines 2A-1, 2B-1~2A-m, 2B-m are connected to sense circuits 26-1~26-m, respectively and is composed of transistors 7A, 7B and capacitors 8A, 8B. Each sense circuit 26 is connected to respond to a pair of column lines 11A and 11B from the column decoder 201. Differential amplifiers 30-1~30-m are provided, which are associated with the sense circuits 26-1~26-m, respectively.

In a representative memory cell 23-11, the transistor 4A and magnetoresistance element 5A are connected to the sense line 2A-1 and the word line 1-1 in the same configuration as in FIG. 1 and the transistor 4B and magnetoresistance element 5B are likewise connected to the sense line 2B-1 and the word line 1-1. Magnetoresistance elements 5A and 5B of each memory cell have opposite directions of magnetization so that when one of the elements is in a high resistance state the other element is in a low resistance state.

In each sense circuit 26, the transistor 7A has its inverted gate connected to the column line 11-1 and its source-drain path connected between the voltage source 9 and the sense line 2A-1. Capacitor 8A is connected between the sense line 2A-1 and ground. In a similar manner, the transistor 7B has its inverted gate connected to the column line 11-1 and its source-drain path connected between the voltage source 9 and the sense line 2B-1. Capacitor 8B is connected between the sense line 2B-1 and ground.

Differential amplifier 30-1 is connected to the capacitors 8A and 8B to produce an output voltage representative of the difference between the voltage developed by capacitor 8A according to the magnetization of magnetoresistance element 5A a predetermined time "t" after the transistor 7A is turned OFF and the voltage developed by capacitor 8B according to the magnetization of magnetoresistance element 5B the time "t" after the transistor 7B is turned OFF.

As given by Equation (2), the time-varying voltages developed on capacitors 8A and 8B vary depending on the electrical resistance of the magnetoresistance elements 4A and 4B. If a "1" is to be stored on the memory cell 23-11, the magnetoresistance elements 4A and 4B are set in high and low resistance states, respectively. In this case, the time-varying voltage on capacitor 8B is higher than the time-varying voltage on capacitor 8A. Conversely, if a "0" is stored on the memory cell 23-11, the magnetoresistance elements 4A and 4B are set in low and high resistance states, respectively. In this case, the time-varying voltage on capacitor 8A is higher than the time-varying voltage on capacitor 8B.

In quantitative terms, the output voltage $V_{OUT}(t)$ of the differential amplifier 30 "t" time after the turn-off of transistors 7A and 7B is given by the following Equation:

$$V_{OUT}(t) = \frac{V_S}{C}\left(\frac{1}{R_L} - \frac{1}{R_H}\right)t \tag{3}$$

where, $R_L$ is the value of the load resistance of the transistor 4A or 4B when the magnetoresistance element 5A or 5B is in a low resistance state and $R_H$ is the value of that load resistance when the magnetoresistance element 5B or 5A is in a high resistance state. Note that the load resistance of a transistor of a memory cell is a resultant value of the resistances of the sense line, the magnetoresistance element and the transistor. If C=1 pF, $V_S$=250 mV, $R_L$=10 kΩ and $R_H$=12 kΩ and if the discharge time of each of capacitors 8A, 8B is 24 nanoseconds, an output voltage $V_{OUT}$(t=23 ns) of ±100 mV will be produced in response to a "1" or "0" stored in the memory cell. In a practical aspect, the output voltage of this level is comparable to the input voltage of sense amplifiers used in conventional dynamic RAMs.

Figure 3:
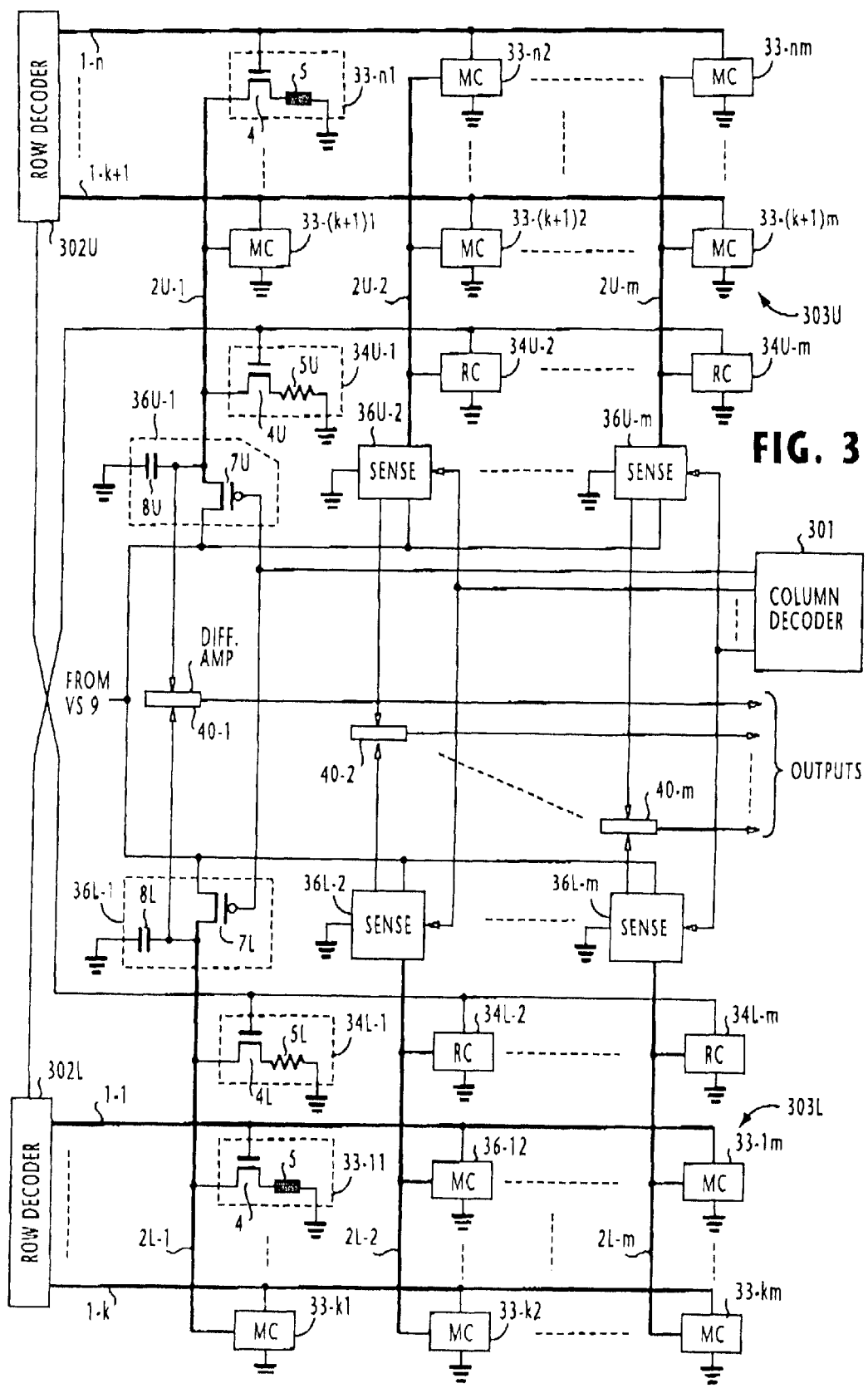
FIG. 3 is a block diagram of a magnetic random access memory according to a third embodiment of the present invention.

FIG. 3 is a block diagram of a third embodiment of the present invention. In this embodiment, the memory cells are divided into a first cell array 303L of memory cells 33-11~33-km and a second cell array 303U of memory cells 33-(k+1)1~33-nm. Memory cells of the first cell array 303A are connected to the intersections of word lines 1-1~1-k of a row decoder 302L and sense lines 2L-1~2L-m, which are in turn connected to a plurality of sense circuits 36L-1~36L-m. Memory cells of the second cell array 303U are connected to the intersections of the word lines 1-k+1~1-n of a row decoder 302U and the sense lines 2U-1~2U-m, which are in turn connected to a plurality of sense circuits 36U-1~36U-m corresponding to the sense circuits 36L-1~36L-m, respectively. The differences between the output voltages of sense circuits 36L and the corresponding sense circuits 36U are detected by differential amplifiers 40-1~40-m, respectively. All sense circuits 36 are of identical configuration to the sense circuits of FIG. 1. Column decoder 301 supplies a column select signal to the transistors 7 of a corresponding pair of sense circuits 36L and 36U to discharge their capacitors 8 at the same time.

A plurality of reference cells 34L-1~34L-m are connected to the sense lines 2L-1~2L-m and a plurality of reference cells 34U-1~34U-m are connected to the sense lines 2U-1~2U-m. All reference cells 34L are each composed of a MOS transistor 4U and a reference resistor 5U and all reference cells 34L are each composed of a MOS transistor 4L and a reference resistor 5L. In each reference cell 34, the source-drain path of its transistor is connected between the corresponding sense line and ground through the reference resistor. The gates of transistors 4U are connected together to the row decoder 302L and the gates of transistors 4L are connected together to the row decoder 302U. Row decoder 302L turns ON the reference transistors of all reference cells 34U when reading one of the memory cells of the cell array 303L and the row decoder 302U turns ON the reference transistors of all reference cells 34L when reading the memory cells of the cell array 303U.

When the memory cell 33-11 of cell array 303L is addressed during a read operation, for example, the transistors 7L and 7U of the sense circuits 36L-1 and 36U-1 turn OFF simultaneously, and the energy stored on capacitor 8U is discharged through the transistor 4U and resistor 5U of the reference cell 34U-1 to ground. Concurrently, the energy stored on capacitor 8L is discharged to ground through the transistor 4 and magnetoresistance element 5 of the cell 33-11. The difference between the voltages developed on the capacitors 8U and 8L is detected by the differential amplifier 40-1 as a stored content of the addressed memory cell 33-11.

When the memory cell 33-n1 of the array 303U is addressed, the energy stored on capacitor 8U is discharged to ground through the transistor 4 and magnetoresistance element 5 of the cell 33-n1. Concurrently, the energy stored on capacitor 8L is discharged through the transistor 4L and resistor 5L of the reference cell 34L-1 to ground. In this way, the difference between the voltages developed on the capacitors 8U and 8L is detected by the differential amplifier 40-1 as a stored content of the addressed memory cell 33-n1.

The symmetrical arrangement of the cell arrays 303L and 303U with respect to the reference cells 34U and 34L serves to reduce performance variability which would otherwise be caused by device tolerances.

Figure 4:
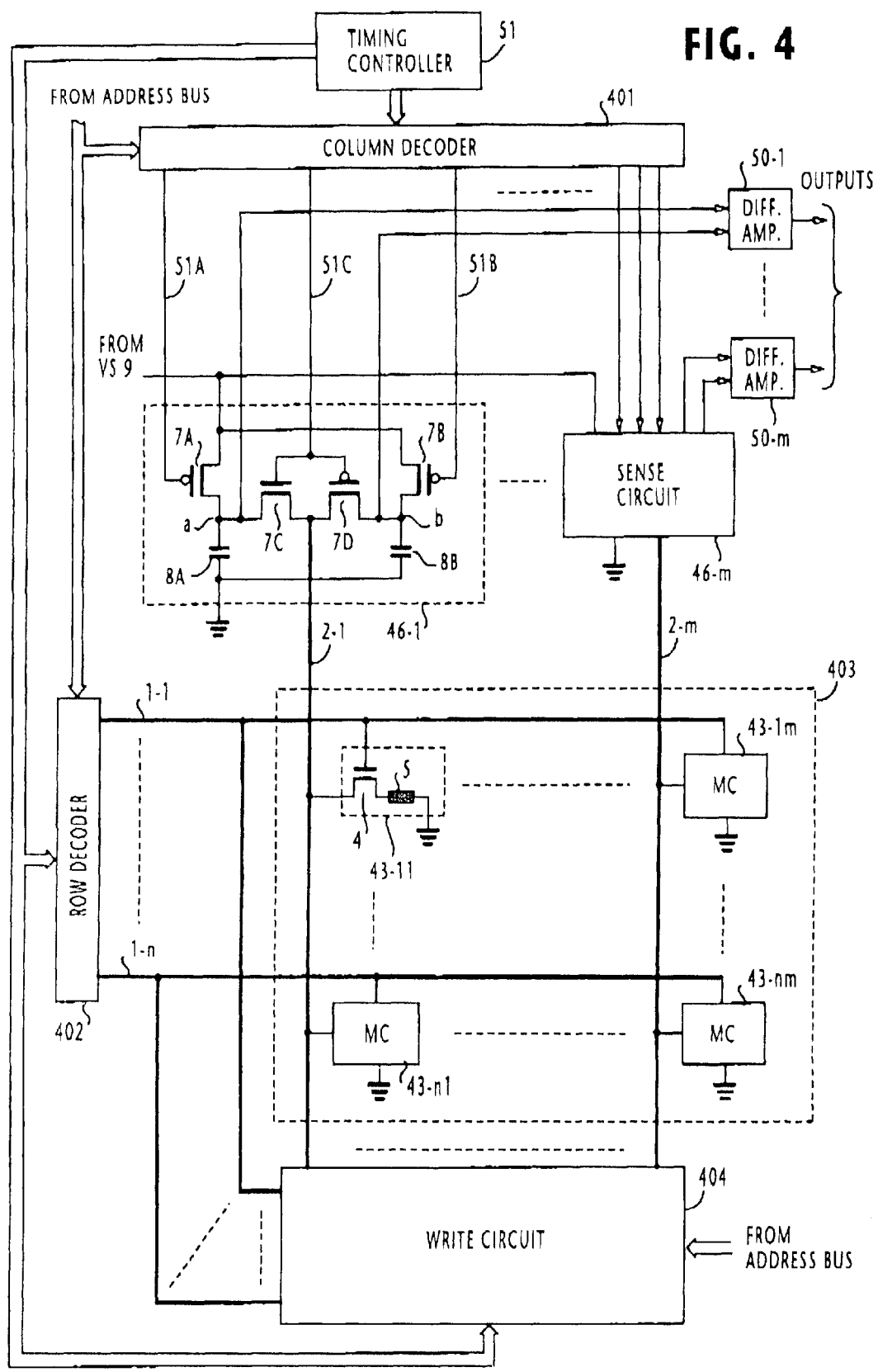
FIG. 4 is a block diagram of a magnetic random access memory according to a fourth embodiment of the present invention.

In a fourth embodiment of the present invention shown in FIG. 4, each memory cell has dual functions of first reading a stored data value and then reading a stored reference value after having a write circuit store the reference value.

The memory of FIG. 4 is comprised of a column decoder 401 including "m" sets of column output lines 51A, 51B, 51C that correspond to the sense lines 2-1~2-m. Each set of column output lines 51 is connected to a corresponding one of a plurality of column drive and sense circuits 46-1~46-m. Row decoder 402 drives the word lines 1-1~1-n and the sense circuits 46 drive the sense lines 2-1~2-m. Memory cells 43, which form a cell array 403, are connected to the intersections of these word and sense lines in a manner similar to the first embodiment. A write circuit 404 is connected to the word lines 1 and the sense lines 2 for writing data into the magnetoresistance elements 5 of the memory cells 43 according to row and column addresses supplied from the address bus during a write mode of the MRAM.

A timing controller 51 is provided for controlling the operation of the column decoder 401, the row decoder 402 and the write circuit 404.

Each of the sense circuits 46 is comprised of MOS transistors 7A, 7B and capacitors 8A, 8B for developing data and reference voltages, respectively. The source-drain paths of transistors 7A and 7B and the capacitors 8A and 8B are connected in series between the voltage source 9 and ground, and the inverted gates of transistors 7A and 7B are respectively connected to the column output lines 51A and 51B. A circuit node "a" between the transistor 7A and the capacitor 8A of each sense circuit 46 is connected to the first input of a differential amplifier 50 which corresponds to the sense circuit and a circuit node "b" between the transistor 7B and the capacitor 8B of the sense circuit 46 is connected to the second input of the differential amplifier 50.

MOS transistors 7C and 7D are provided in each of the sense circuits 46. In each sense circuit, the transistor 7C has its source-drain path connected between the circuit node "a" and the corresponding sense line 2 for producing a data voltage on capacitor 8A and the transistor 7D has its source-drain path connected between the circuit node "b" and the corresponding sense line for producing a reference voltage on capacitor 8B. The gate of transistor 7C and the inverted gate of transistor 7D are connected together to the column output line 51C to mutually exclusively establish a discharging path for the capacitors 8A and 8B to the corresponding sense line.

When the magnetic RAM is in an idle state, the output lines 51A are 51B of all sets of output lines are driven to a low level and the output lines 51C of all sets are driven to a high level. As a result, the transistors 7A, 7B and 7C of all sense circuits 46 switch to an ON state and their transistors 7D are in an OFF state, setting all sense lines 2 at the initial voltage $V_{D0}$. Therefore, the capacitors 8A and 8B of all sense circuits are charged to the initial voltage $V_{D0}$.

During a write mode, the write circuit 404 activates one of its arrayed coils that corresponds to a memory cell 43 to be addressed and magnetizes the magnetoresistance element 5 of the memory cell in a direction according to the binary level of the information to be stored in that memory cell.

During a read mode, the timing controller 51 first causes the row decoder 402 to address one of the word lines 1 with a reference voltage $V_{ref}$. This turns ON all transistors 4 of the memory cells 43 attached to the addressed word line. Since the transistors 7A, 7C of each sense circuit 46 are in the ON state, a current flows from the voltage source 9 into the magnetoresistance element 5 of all memory cells of the addressed word line. Then, the timing controller 51 causes the column decoder 401 to switch one of its the output lines 51A from low to high level. This turns OFF the transistor 7A, causing the associated capacitor 8A to begin to discharge its stored energy through the associated transistor 7C to the magnetoresistance element 5 of the addressed memory cell. As a result, the voltage across the capacitor 8A drops with time as defined in Equation (2).

A predetermined time after the turn-off of the transistor 7A, the timing controller 51 directs the row decoder 402 to removes the reference voltage $V_{ref}$ from the addressed word line, so that the transistors 4 of all memory cells of the word line are turned OFF, thus stopping the discharging current that is flowing from the capacitor 8A to the magnetoresistance element 5 of the address memory cell. Timing controller 51 then operates the write circuit 404 to magnetize the magnetoresistance element 5 of the addressed memory cell in such a direction that the magnetoresistance element is switched to a predetermined reference state.

Timing controller 51 then directs the column decoder 401 to cause the column output line 51C to switch from high to low level, so that the transistor 7C is tuned OFF and the transistor 7D is turned ON, and directs the row decoder 402 to apply the reference voltage again to the addressed word line to turn the transistors 4 of the word line to an ON state. Since the transistors 7B, 7D of the addressed sense circuit and the transistor 4 of the addressed memory cell are in the ON state, a current flows into the magnetoresistance element 5 of the addressed memory cell.

Timing controller 51 then directs the column decoder 401 to cause the column output line 51B to switch from low to high level, thus switching the transistor 7B to an OFF state. As a result, the capacitor 8B begins to discharge its energy and the voltage across this capacitor drops at a rate determined by the stored reference state of the magnetoresistance element 5.

A predetermined time after the turn-off of the transistor 7B, the timing controller 51 directs the row decoder 402 to remove the reference voltage from the addressed word line in order to turn OFF the transistors 4 of the memory cells of the address word line, thus stopping the discharging current supplied from the capacitor 8B to the magnetoresistance element 5 of the address memory cell.

Thus, a voltage is stored on the capacitor 8A as a representative of the binary state of the information stored in the addressed memory cell and a voltage is stored on the capacitor 8B as a representative of the reference state of the addressed memory cell. The difference between these voltages is detected by the corresponding differential amplifier 50.

Figure 5:
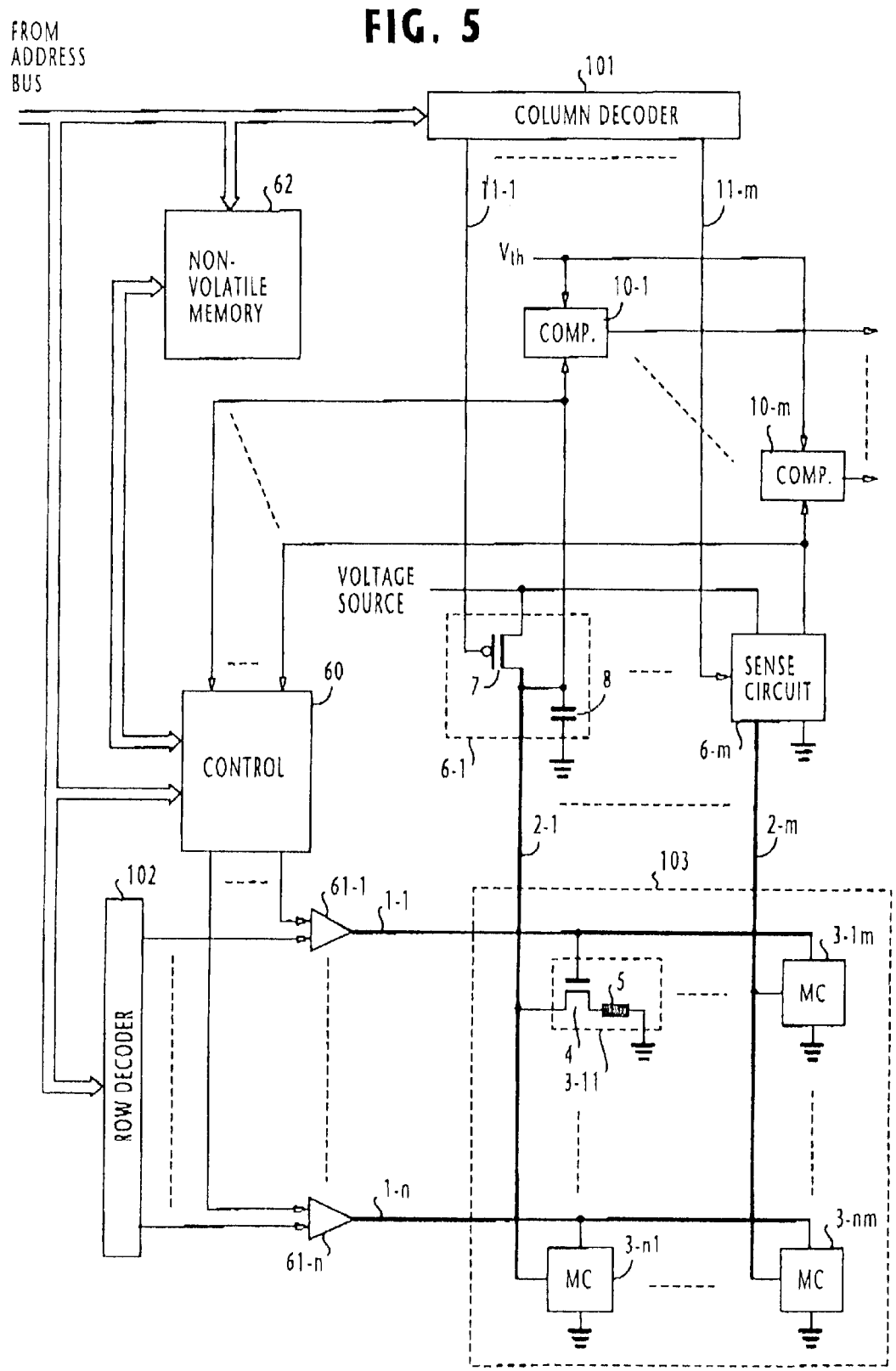
FIG. 5 is a block diagram of a magnetic random access memory according to a fifth embodiment of the present invention.

A fifth embodiment of the present invention is shown in FIG. 5. This embodiment is useful to maintain the sense currents of the memory at equal values regardless of variability in the operating characteristics of magnetoresistance elements resulting from manufacturing tolerances. To this end, a feedback voltage control loop is provided. In FIG. 5, the arrangement of FIG. 1 is used as an example for describing the feedback control system.

The outputs of sense circuits 6-1~6-m are supplied to a controller 60., which controls the setting of a plurality of gain-controlled amplifiers 61-1~61-n for controlling the voltages supplied from the row decoder 102 to the word lines 1—1~1-m.

During a calibration mode which begins immediately after initialization, all memory cells are sequentially addressed row by row and column by column. Each gain-controlled amplifier 61 controls its setting in accordance with a control signal from the controller 60 until the voltage of the addressed sense line reaches an optimum level for an addressed memory cell. When this occurs, the controller 60 determines the trimming value that was needed to adjust the word-line voltage from the row decoder 102 to produce the optimum sense line voltage for the address memory cell and stores it into a location of a nonvolatile memory 62 corresponding to that memory cell.

During a read mode, the controller 60 reads a stored trimming value of an addressed memory cell from the corresponding location of the nonvolatile memory 62 and selects the gain-controlled amplifier 61 to which the addressed memory cell is connected and uses the read trimming value to adjust the setting of the selected gain-controlled amplifier.

In this way, differences in operating characteristics among the magnetoresistance elements are compensated for by the stored trimming values and the sense line voltages are equal to each other. As a result, when a particular magnetoresistance element has a high electrical resistance, the associated word line voltage is set at a high voltage level, or when the threshold level of the switching transistor of a memory cell is offset from the optimum level, the associated word line voltage is adjusted to compensate for the offset.

This embodiment is particularly useful for memories where a great number of memory cells are connected to a sense line in comparison with the number of cells connected to a word line since the memory cells connected to different sense lines use different capacitors. Thus, the magnetic RAM of this invention is basically tolerant of performance variability that exists in the direction of the word lines. The memory can be made tolerant of large variability along the word lines by individually setting the readout time "t" of Equation (2) for each sense line.

What is claimed is:

1. A magnetic random access memory comprising:
    a plurality of word lines;
    a plurality of sense lines;
    a matrix array of memory cells, each memory cell being located on an intersection of a corresponding one of said word lines and a corresponding one of said sense lines, each memory cell including a magnetoresistance element and a switching element which establishes a resistive connection between the corresponding sense line and the magnetoresistance element when the corresponding word line is addressed; and
    a plurality of sense circuits respectively corresponding to said sense lines, each sense circuit including a capacitive element connected to the corresponding sense line and a switching element for applying a voltage to the capacitive element and removing the voltage when the corresponding sense line is addressed, thereby discharging energy from said capacitive element through said resistive connection to said magnetoresistance element.

2. The magnetic random access memory of claim 1, further comprising a plurality of comparators respectively corresponding to said sense circuits, each of the comparators comparing a voltage developed by the capacitive element of the corresponding sense circuit with a threshold voltage for producing an output voltage at one of two binary levels.

3. The magnetic random access memory of claim 1, wherein said magnetoresistance element of each of said memory cells is of tunnel junction type.

4. The magnetic random access memory of claim 1, wherein said magnetoresistance element of each of said memory cells comprises a giant magnetoresistance element.

5. The magnetic random access memory of claim 1, wherein said capacitive element of each of said sense circuits comprises a capacitor.

6. The magnetic random access memory of claim 1, wherein said capacitive element of each of said sense circuits comprises a parasitic capacitance of the corresponding sense line.

7. A magnetic random access memory comprising:
    a plurality of word lines;
    a plurality of pairs of sense lines;
    a matrix array of memory cells, each memory cell being located on an intersection of a corresponding one of said word lines and a corresponding one of the pairs of said sense lines, each memory cell including a first magnetoresistance element and a first switching element which establishes a first resistive connection between a first one of the corresponding pair of sense lines and the first magnetoresistance element when the corresponding word line is addressed, each memory cell further including a second magnetoresistance element and a second switching element which establishes a second resistive connection between a second one of the corresponding pair of sense lines and the second magnetoresistance element when the corresponding word lines is addressed; and a plurality of sense circuits respectively corresponding to said pairs of sense lines, each sense circuit including a first capacitive element connected to a first one of the corresponding pair of sense lines and a first switching element for applying a voltage to the first capacitive element and removing the voltage when said first one of the corresponding pair of sense lines is addressed, thereby discharging energy from said first capacitive element through said first resistive connection to said first magnetoresistance element, each sense circuit further including a second capacitive element connected to a second one of the corresponding pairs of sense lines and a second switching element for applying a voltage to the second capacitive element and removing the voltage when the second one of the corresponding pair of sense lines is addressed simultaneously with said first one of the corresponding pair of sense lines, thereby discharging energy from said second capacitive element through said second resistive connection to said second magnetoresistance element.

8. The magnetic random access memory of claim 7, further comprising a plurality of differential amplifiers respectively corresponding to said sense circuits, each of the differential amplifiers producing a difference output representative of the difference between voltages developed by the first and second capacitive elements.

9. A magnetic random access memory comprising:

a first plurality of word lines;

a second plurality of word lines;

a first plurality of sense lines;

a second plurality of sense lines;

a first plurality of reference cells respectively corresponding to said first plurality of sense lines, each reference cell including a resistance element and a switching element for establishing a resistive connection between the resistance element and the corresponding sense line when one of said second plurality of word lines is addressed;

a second plurality of reference cells respectively corresponding to said second plurality of sense lines, each reference cell including a resistance element and a switching element for establishing a resistive connection between the resistance element and the corresponding sense line when one of said first plurality of word lines is addressed;

a first matrix array of memory cells, each memory cell being located on an intersection of a corresponding one of said first plurality of word lines and a corresponding one of said first plurality of sense lines, each memory cell including a magnetoresistance element and a switching element for establishing a resistive connection between the corresponding sense line and the magnetoresistance element when the corresponding word line is addressed;

a second matrix array of memory cells, each memory cell being located on an intersection of a corresponding one of said second plurality of word lines and a corresponding one of said second plurality of sense lines, each memory cell including a magnetoresistance element and a switching element for establishing a resistive connection between the corresponding sense line and the magnetoresistance element when the corresponding word line is addressed;

a first plurality of sense circuits respectively corresponding to said first plurality of sense lines, each sense circuit including a capacitive element connected to the corresponding sense line and a switching element for applying a voltage to the capacitive element and removing the voltage when the corresponding sense line is addressed for discharging energy from said capacitive element to the corresponding sense line; and a second plurality of sense circuits respectively corresponding to said second plurality of sense lines, each sense circuit including a capacitive element connected to the corresponding sense line and a switching element for applying a voltage to the capacitive element and removing the voltage when the corresponding sense line is addressed for discharging energy from the capacitive element to the corresponding sense line.

10. The magnetic random access memory of claim 9, further comprising a plurality of differential amplifiers, each differential amplifier producing an output voltage representative of the difference between a voltage developed across the capacitive element of a corresponding one of said first plurality of sense circuits and a voltage developed across the capacitive element of a corresponding one of said second plurality of sense circuits.

11. The magnetic random access memory of claim 9, wherein said first plurality of reference cells, said first matrix array of memory cells, and said first plurality of sense circuits are located symmetrically to said second plurality of reference cells, said second matrix array of memory cells, and said second plurality of sense circuits with respect to said plurality of differential amplifiers.

12. A magnetic random access memory comprising:

a plurality of word lines;

a plurality of sense lines;

a matrix array of memory cells, each memory cell being located on an intersection of a corresponding one of said word lines and a corresponding one of said sense lines, each memory cell including a magnetoresistance element and a switching element which establishes a resistive connection between the corresponding sense line and the magnetoresistance element when the corresponding word line is addressed; and a plurality of sense circuits respectively corresponding to said sense lines, each sense circuit including:

a first capacitive element;

a first switching element for applying a voltage to the first capacitive element through a first circuit node;

a second capacitive element;

a second switching element for applying a voltage to the second capacitive element through a second circuit node; and a third switching element for exclusively connecting one of the first circuit node and the second circuit node to the corresponding sense line;

a timing controller;

a column decoder for selectively addressing said sense lines, the column decoder being responsive to control signals from the timing controller for controlling the first, second and third switching elements of one of the sense circuits corresponding to the addressed sense line for discharging energy thereto from the first capacitive element of said one sense circuit and discharging energy thereto from the second capacitive element of said one sense circuit; and a row decoder for selectively addressing said word lines;

a write circuit for initially setting one of the memory cells addressed by said column and row decoders in one of high and low resistance states depending on information to be stored therein, said write circuit being responsive to a control signal from said timing controller for setting said one memory cell in a reference resistance state after energy is discharged from said first capacitive element.

13. The magnetic random access memory of claim 12, further comprising a plurality of differential amplifiers respectively corresponding to said sense circuits, each differential amplifier being connected to the first and second circuit nodes of the corresponding sense circuit for producing a voltage representative of the difference between voltages developed at said first and second circuit nodes.

14. A magnetic random access memory comprising:

a plurality of word lines;

a plurality of sense lines;

a matrix array of memory cells, each memory cell being located on an intersection of a corresponding one of said word lines and a corresponding one of said sense lines, each memory cell including a magnetoresistance element and a switching element which establishes a resistive connection between the corresponding sense line and the magnetoresistance element when the corresponding word line is addressed;

a plurality of sense circuits respectively corresponding to said sense lines, each sense circuit including a capacitive element connected to the corresponding sense line and a switching element for applying a voltage to the capacitive element and removing the voltage when the corresponding sense line is addressed, thereby discharging energy from said capacitive element through said resistive connection to said magnetoresistance element;

a column decoder for selectively addressing said sense lines;

a row decoder for selectively addressing said word lines;

a plurality of voltage controllers respectively connected to said word lines;

a controller for respectively controlling said voltage controllers according to the voltages respectively produced by said sense circuits when said memory cells are individually addressed by said column and row decoders during a calibration mode so that said voltages produced by said sense circuits are adjusted to an equal value and producing, for each of the memory cells, a trimming value by which each of said voltage controllers is controlled; and a nonvolatile memory for storing said trimming values, said controller reading a trimming value from said nonvolatile memory corresponding to each of the memory cells addressed during a read mode and controlling one of said voltage controllers corresponding to the addressed memory cell according to the read value.

* * * * *